US011315813B2

(12) United States Patent
Wagenleitner et al.

(10) Patent No.: US 11,315,813 B2
(45) Date of Patent: Apr. 26, 2022

(54) SUBSTRATE HOLDER AND METHOD FOR BONDING TWO SUBSTRATES

(71) Applicant: EV Group E. Thallner GmbH, St. Florian am Inn (AT)

(72) Inventors: Thomas Wagenleitner, Aurolzmunster (AT); Thomas Plach, Stadl-Paura (AT); Jurgen Michael Suss, Rainbach (AT); Jurgen Mallinger, St. Florian am Inn (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 213 days.

(21) Appl. No.: 15/551,733

(22) PCT Filed: Apr. 10, 2015

(86) PCT No.: PCT/EP2015/057859
§ 371 (c)(1),
(2) Date: Aug. 17, 2017

(87) PCT Pub. No.: WO2016/162088
PCT Pub. Date: Oct. 13, 2016

(65) Prior Publication Data
US 2018/0040495 A1    Feb. 8, 2018

(51) Int. Cl.
*H01L 21/68* (2006.01)
*H01L 21/673* (2006.01)
(Continued)

(52) U.S. Cl.
CPC .. *H01L 21/67346* (2013.01); *H01L 21/67092* (2013.01); *H01L 21/67109* (2013.01); *H01L 21/68* (2013.01); *H01L 24/80* (2013.01)

(58) Field of Classification Search
CPC ......... H01L 21/67346; H01L 21/67092; H01L 21/67109; H01L 21/68; H01L 24/80
See application file for complete search history.

(56) References Cited

U.S. PATENT DOCUMENTS 4,876,221 A * 10/1989 Hatada ................... H01L 24/80
228/123.1
5,769,991 A    6/1998 Miyazawa et al.
(Continued)

FOREIGN PATENT DOCUMENTS

| CN | 1209644 A | 3/1999 |
| CN | 103718282 A | 4/2014 |

(Continued)

OTHER PUBLICATIONS

International Search Report from corresponding International Patent Application No. PCT/EP2015/057859, dated Oct. 19, 2015.
(Continued)

*Primary Examiner* — Jeffry H Aftergut
*Assistant Examiner* — Jaeyun Lee
(74) *Attorney, Agent, or Firm* — Kusner & Jaffe

(57) ABSTRACT

A substrate holder having a fixing surface for holding a substrate, a system having such a substrate holder, a use of such a substrate holder, a method for bonding two substrates and a product, particularly a substrate stack, produced using such a method and also a use of such a substrate holder for such a method.

7 Claims, 5 Drawing Sheets

(51) Int. Cl.
*H01L 21/67* (2006.01)
*H01L 23/00* (2006.01)

(56) References Cited

U.S. PATENT DOCUMENTS

| | | | |
|---|---|---|---|
| 6,108,190 A | 8/2000 | Nagasaki | |
| 6,140,616 A | 10/2000 | Andberg | |
| 6,451,670 B1 | 9/2002 | Takisawa et al. | |
| 6,706,618 B2 | 3/2004 | Takisawa et al. | |
| 7,161,121 B1 | 1/2007 | Steger | |
| 7,718,932 B2 | 5/2010 | Steger | |
| 8,717,543 B2 | 5/2014 | Shibazaki | |
| 8,999,090 B2 | 4/2015 | Gaudin et al. | |
| 9,613,840 B2 | 4/2017 | Wagenleitner | |
| 2003/0089457 A1* | 5/2003 | Nallan | H01J 37/32431 156/345.51 |
| 2003/0159307 A1 | 8/2003 | Sago et al. | 34/107 |
| 2004/0115947 A1 | 6/2004 | Fink et al. | |
| 2007/0007276 A1 | 1/2007 | Steger | 219/494 |
| 2007/0252970 A1 | 11/2007 | Shibazaki | |
| 2008/0200008 A1 | 8/2008 | Kerdiles et al. | |
| 2009/0127315 A1* | 5/2009 | Okita | H01L 24/75 228/102 |
| 2010/0141924 A1 | 6/2010 | Shibazaki | |
| 2012/0193009 A1 | 8/2012 | Fujii | |
| 2012/0196242 A1 | 8/2012 | Volfovski et al. | |
| 2012/0247645 A1 | 10/2012 | Tsutsumi et al. | |
| 2014/0209230 A1 | 7/2014 | Wagenleitner | |
| 2014/0252635 A1* | 9/2014 | Tran | H01L 25/0657 257/773 |
| 2015/0044786 A1 | 2/2015 | Huang et al. | |
| 2015/0050778 A1* | 2/2015 | Asahi | H01L 24/75 438/108 |
| 2015/0332942 A1 | 11/2015 | Peh et al. | |
| 2017/0203377 A1 | 7/2017 | Yokoyama et al. | |

FOREIGN PATENT DOCUMENTS

| | | |
|---|---|---|
| CN | 104145328 A | 11/2014 |
| CN | 104364882 A | 2/2015 |
| JP | 2001-135756 A | 5/2001 |
| JP | 2002-526936 A | 8/2002 |
| JP | JP-2005-302858 A | 10/2005 |
| JP | 2009-512193 A | 3/2009 |
| JP | 2011-514669 A | 5/2011 |
| JP | 2011-114278 A | 6/2011 |
| JP | 2011-216832 A | 10/2011 |
| JP | 2012-160628 A | 8/2012 |
| JP | 2013-191789 A | 9/2013 |
| JP | 2014-179542 A | 9/2014 |
| JP | 2015-015269 A | 1/2015 |
| WO | WO-2006/025341 A1 | 3/2006 |
| WO | WO-2009/101495 A1 | 8/2009 |
| WO | WO 2013/023708 A1 | 2/2013 |
| WO | WO 2013/091714 A1 | 6/2013 |
| WO | WO 2013/137002 A1 | 9/2013 |
| WO | WO-2014/191033 A1 | 12/2014 |
| WO | WO-2015-175339 A1 | 11/2015 |
| WO | WO-2016/104710 A1 | 6/2016 |

OTHER PUBLICATIONS

Mack, Chris "Fundamental Principles of Optical Lithography," The Science of Microfabrication, 2007, p. 321.

* cited by examiner

SUBSTRATE HOLDER AND METHOD FOR BONDING TWO SUBSTRATES

FIELD OF THE INVENTION

The present invention relates to a substrate holder, a system having such a substrate holder, a use of such a substrate holder, a method for bonding two substrates and a product, particularly a substrate stack, produced using such a method and also a use of such a substrate holder for such a method.

BACKGROUND OF THE INVENTION

In the semiconductor industry, substrates, particularly wafers, are aligned with respect to one another and connected to one another using different methods. The process of connecting is called bonding. Depending on the materials to be connected, different bonding technologies must be applied in order to achieve an optimum result.

Thus, metals are bonded to one another by means of diffusion processes at high temperatures and high pressures for example, although technologies for bonding at room temperature have become more and more established in recent years.

Substrates with surfaces whose atoms preferably form covalent bonds are connected to one another directly by means of adhesion forces. However, the adhesion forces do not represent maximum connection strength between the surfaces, as this is initially only a van-der-Waals bond. By means of appropriate processes, particularly heat treatments, van-der-Waals bonds of this type can be converted into covalent bonds. Bonding processes in which a connection of two surfaces takes place by forming covalent compounds are termed fusion bond processes. In recent years it has also become more and more apparent that above all, maximising the contact surface contributes decisively to improving such a bond. This resulted in entirely new possibilities for connecting surfaces of this type to one another even at room temperature, particularly without heat treatment or only with a very slight temperature increase. Recently, measurements have shown that connection strengths of close to the theoretical strength of the materials to be connected to one another can be achieved by means of such an optimisation.

In the case of fusion bonds it must primarily be ensured that neither of the two substrates stretches before and/or during and/or after the alignment, particularly due to thermal loading. Stretching leads to an enlargement or reduction in size of the substrate and therefore to displacement and/or mis-orientation of the features, particularly chips, of the substrate which are to be aligned with one another. This displacement and/or mis-orientation generally runs from the centre to the edge. The resultant fault is known in the prior art, but particularly in the semiconductor industry, by the name run-out. Compensating the fault is termed run-out compensation. This fault is explained more precisely in the following.

One of the greatest technical problems when permanently connecting two substrates is the alignment accuracy of the functional units between the individual substrates. Although the substrates can be aligned to one another very accurately by means of alignment systems, distortions of the substrates may occur during the bonding process itself. Due to the distortions that arise in such a manner, the functional units are not necessarily aligned correctly with respect to one another at all positions. The alignment accuracy at a certain point on the substrate may be a result of a distortion, a scaling fault, a lens fault (magnification or minimisation fault), etc. In the semiconductor industry, all topics concerned with problems of this type are subsumed under the term "overlay". An appropriate introduction to this subject can be found for example in: Mack, Chris. *Fundamental Principles of Optical Lithography—The Science of Microfabrication.* WILEY, 2007, Reprint 2012.

Each functional unit is designed on the computer in advance of the actual production process. For example, conductor tracks, microchips, MEMS, or any other structure that can be produced with the aid of microsystems technology, are designed in a CAD (computer-aided design) program. During the production of the functional units, it is apparent however, that there is always a difference between the ideal functional units designed on the computer and the real functional units produced in the clean room. The differences can predominantly be traced back to limitations of the hardware, that is technical engineering problems, but can very often be traced back to physical limits. So the resolution accuracy of a structure which is produced by means of a photolithographic process is limited by the size of the apertures in the photomask and the wavelength of the light used. Mask distortions are transmitted directly into the photoresist. Linear motors of machines can only travel to reproducible positions etc., within a predetermined tolerance. Therefore, it is no wonder that the functional units of a substrate cannot exactly match the structures designed on the computer. Therefore, all substrates already have an unreliable deviation from the ideal state before the bonding process.

If one then compares the positions and/or shapes of two opposite functional units of two substrates assuming that none of the two substrates is distorted by a connection process, then one determines that there is generally already imperfect congruence of the functional units, because the same deviate from the ideal computer model due to the above-described faults. The most common faults are illustrated in FIG. 8 (reproduced from: http://commons.wikimedia.org/wiki/File:Overlay_-_typical_model_terms_DE.svg 24 May 2013 and Mack, Chris. *Fundamental Principles of Optical Lithography—The Science of Microfabrication.* Chichester: WILEY, p. 312, 2007. Reprint 2012). According to the images, one can make a rough distinction between global and local or symmetric and asymmetric overlay faults. A global overlay fault is homogeneous and therefore independent of the location. It creates the same deviation between two opposite functional units, independently of the position. The classic global overlay faults are the faults of types I. and II., which arise due to a translation or rotation of the two substrates with respect to one another. The translation or rotation of the two substrates creates a corresponding translational or rotational fault for all, in each case opposite, functional units on the substrates. A local overlay fault occurs in a location-dependent manner, predominantly due to elasticity and/or plasticity problems, primarily caused in the present case by the continually propagating bond wave. Of the overlay faults illustrated, it is primarily the faults III. and IV. which are termed "run-out" faults. This fault occurs primarily due to a distortion of at least one substrate during a bonding process. Due to the distortion of at least one substrate, the functional units of the first substrate are also distorted with respect to the functional units of the second substrate. The faults I. and II. can however likewise occur due to a bonding process, but are for the most part overlaid by the faults III. and IV. to such an extent that they can only be detected or measured with difficulty.

The greatest problem when bringing two substrates closer together lies in the fact that the environment is generally not in thermodynamic balance with the substrates. Thermodynamic balance is always present if all intensive thermodynamic variables, in this specific case the temperature in particular, are equal for all subsystems to be considered. In many cases, one of the substrates, particularly the substrate which is fixed on the lower substrate holder, has an increased temperature.

In many cases it is desired or even intended to set a different, in particular higher, temperature for the lower substrate than is present at the upper substrate, in order to compensate the previously mentioned run-out faults of the substrates in a controlled manner. In this case, it may be necessary to correspondingly temper, particularly to heat or to cool, the lower substrate.

If one then brings the first, upper substrate, which is fixed on the substrate holder according to the invention, towards the second, lower substrate, then the second, lower substrate, particularly however also the entire lower substrate holder, can heat and thermally expand the upper, first substrate and primarily offer a very complicated heating profile. The heating profile is determined by means of a temperature/time curve. In this case even a very slight temperature difference between the first and second substrates can lead to a significant expansion of the upper, first substrate or the upper, first substrate may be heated in accordance with a complicated temperature curve. The temperature of the upper substrate increases with increasing distance between the two substrates and remains constant for a short time in a saturation region, before it decreases, exponentially in particular, due to a further process and subsequently remains constant in the event of unchanged boundary conditions. The prior art principally has the problem that the substrates are bonded to one another in temperature regions in which the temperature changes as a function of time. Thus, the bond wave is subject to different temperatures at different times or to put it another way, at different positions, and therefore creates the above-mentioned run-out faults.

SUMMARY OF THE INVENTION

It is therefore the object of the present invention to overcome the disadvantages of the prior art and in particular to show an improved substrate holder and an improved method, with the aid of which the run-out fault can be compensated and in particular prevented altogether.

This object is achieved with the substrate holder according to the invention, the system according to the invention, the use according to the invention, the method according to the invention and the product according to the invention as well as the use according to the invention according to the coordinate claims.

Advantageous developments of the invention are specified in the subclaims. All combinations of at least two features specified in the description, the claims and/or the drawings also fall within the scope of the invention. When value ranges are given, values lying inside the limits mentioned should also be considered as disclosed as limit values and claimable in any desired combination.

The core of the invention in particular is designing the in particular upper substrate holder (also termed the first substrate holder in the following) according to the invention in such a manner that any heat that is absorbed, particularly to the rear side of the substrate holder, is dissipated in a controlled manner and emitted there by means of a heat exchanger, so that a heating of the fixed, in particular upper substrate (also termed the first substrate in the following), can be set in a targeted manner.

A further important aspect of the invention is the targeted optimisation of the thermal resistances of the system, in order to enable a targeted setting according to the invention of the temperature difference $\Delta T$.

In particular, it is an important aspect of the invention to set a desired temperature difference $\Delta T$ between the lower and the upper substrate by means of the suitable choice of thermal resistances. This temperature difference $\Delta T$ is generally a function of time or the distance between the two substrates. However, the temperature difference $\Delta T$ in the temperature region of temperature saturation of the lower substrate is predominantly relevant according to the invention, wherein this temperature region is designated with d in the remainder of the patent specification. The temperature difference $\Delta T$ should be kept constant in this temperature region d. By means of the targeted setting and maintenance of the temperature difference $\Delta T$, the disadvantageous "run-out" fault can be minimised or even eliminated entirely.

The temperature difference $\Delta T$, in the temperature saturation region d in particular, is therefore generally set in a targeted manner (i) by means of the thermal resistances and/or (ii) heating elements, particularly of a heating device in the lower substrate holder, and/or (iii) by means of cooling elements, particularly a cooling fluid.

According to the invention, the substrate holder has a fixing surface for holding a substrate, wherein the substrate holder has a heat-conducting body for dissipating heat away from the fixing surface, preferably and/or for feeding heat towards the fixing surface.

A further subject of the present invention relates to a system for bonding a first substrate to a second substrate, having at least one substrate holder according to one of the preceding embodiments for holding at least one of the two substrates. To this end, reference is made in particular to the implementations for the substrate holder.

A further subject of the present invention relates to a use of a substrate holder according to the invention as the upper substrate holder.

A different, in particular stand-alone, subject of the present invention relates to a method for bonding a first substrate to a second substrate, wherein the substrates are brought closer together in a first step, so that the temperature of the first substrate is increased, wherein in a second step, the bringing together of the substrates is stopped and the distance between the substrates is kept constant in such a manner that at a constant distance at least for a period of time, a constant temperature of the first substrate is set, wherein in a third step, within the time period at constant temperature of the first substrate, the two substrates are bonded to one another, at least temporarily.

This circumstance can also be described such that the temperature difference $\Delta T$ between the two substrates is constant in the well-defined temperature region d. Furthermore, the size of the temperature difference $\Delta T$ can be set by correctly choosing the thermal resistances.

A different subject of the present invention relates to a product, particularly a substrate stack, having a first substrate and a second substrate, wherein the substrates are bonded to one another using a method according to the invention.

A different subject of the present invention relates to a use of such a substrate holder for holding a substrate during such a method.

Generally the, in particular upper, substrate holder should be thermally coupled to the ambient temperature as well as possible. This may lead to a supply and/or dissipation of heat. By bringing together the two substrates, the upper substrate in particular is heated by means of the lower substrate or the lower substrate holder. The large thermal mass of the, in particular upper, substrate holder and also the thermal conductivity thereof, which is as high as possible, drains the heat from the, in particular upper, substrate. The substrate holder according to the invention is designed in such a manner that the temperature profile thereof, in particular also the temperature profile of the upper substrate, can be set in a targeted manner when approaching the lower substrate or the lower substrate holder.

The thermal resistances of the substrate holder according to the invention are in this case configured in such a manner that a temperature adaptation of the heat-conducting body and therefore of the upper substrate to the cooling fluid takes place as quickly and efficiently as possible. Therefore the thermal resistances are preferably minimised. The cooling fluid is preferably the surrounding atmosphere. The temperature of the cooling fluid is therefore preferably room temperature.

Knowledge of the temperature/time curve at the, in particular upper, substrate holder or at the, in particular upper, substrate makes it possible to determine the optimum time for bonding in particular, which is simultaneously accompanied by an increase in throughput. The corresponding process or the corresponding method likewise constitutes an important, particularly stand-alone, aspect of the invention according to the invention.

All of the temperature profiles disclosed in the patent specification may be regarded as temperature profiles of a substrate on a substrate holder or as temperature profiles of the substrate holder. The thermal coupling of the substrates to the substrate holder is preferably so efficient that the deviation of the temperature is negligible. In reality, the temperature of the lower substrate can be slightly lower than the temperature of the lower substrate holder in the case of a heating, lower substrate holder. The temperature of the upper substrate is generally slightly higher than the temperature of the upper substrate holder according to the invention. The slight temperature difference is associated with the non-zero thermal resistances between the substrate holders and the substrates.

The substrate holder according to the invention, also termed the sample holder in the following, dissipates any amount of heat arising to the rear in a controlled manner, as already mentioned above, where it is converted by means of a heat exchanger and drained from the substrate holder according to the invention. Furthermore, the large thermal mass of the, in particular upper, substrate holder ensures temperature stabilisation of the, in particular upper, substrate, so that thermal fluctuations of the local environment are minimised to the greatest extent possible. It is a further important aspect according to the invention that the comparatively large thermal mass stabilises the temperature of the upper substrate or the temperature difference $\Delta T$ between the lower and the upper substrate during the bonding process.

Furthermore, knowledge of heat dissipation through the substrate holder according to the invention makes it possible to determine the temperature/time graph for the, in particular upper substrate holder or the upper substrate, and to change the same by means of changes to the parameters of the substrate holder according to the invention.

The substrate holder according to the invention can be used as the upper and/or lower substrate holder. The substrate holder according to the invention is in particular constructed as the upper substrate holder, so that the upper, first substrate fixed on the same is deformed in the direction of gravitation as long as it is not fixed, over the entire area in particular.

In the following, reference is made numerous times to the roughness of a surface. In the literature, the roughness is specified either as mean roughness, quadratic roughness or as averaged surface roughness. The averaged values for the average roughness, the quadratic roughness and the averaged surface roughness generally differ for the same measurement section or measurement area, but lie in the same order of magnitude. Therefore, the following ranges of numerical values for the roughness are to be understood either as values for the average roughness, the quadratic roughness or for the averaged surface roughness.

The substrate holder according to the invention is able to heat and/or to cool the in particular upper, first substrate. By means of the heat-conducting body, heat can be dissipated from the, in particular upper, first substrate and preferably transferred to a cooling fluid. In this case, the heat-conducting body would be a heat sink. It would also be conceivable however that the fluid is a heating fluid which emits heat to the heat-conducting body and thus heats the upper, first substrate. In this case, the heat-conducting body would be a heating body.

The cooling fluid is preferably the atmosphere of the surroundings. The temperature of the cooling fluid is preferably room temperature.

In a preferred embodiment, it is provided that the heat-conducting body has ribs for dissipating and/or supplying the heat, particularly at its side facing away from the fixing surface (also termed the rear side in the following). In particular, the ribs can be arranged on the entire rear side of the heat-conducting body, as a result of which an improved heat exchange may be enabled.

Heat can be distributed across a greater surface area, what is known as the rib surface, by means of the ribs. The ribs can be arranged perpendicularly to the fixing surface in particular. The ribs are preferably arranged parallel to one another. If a heat-conducting body which serves as a heat sink is used, these would be cooling ribs. If a heat-conducting body which serves as a heating body is used, one could term the ribs heating ribs which conduct the heat out of the fluid and into the heat-conducting body in an optimum manner. Only ribs are mentioned again in the following. Insofar as cooling is discussed predominantly in the following and it is not explicitly mentioned, the heat-conducting body is considered a heat sink, the ribs are considered cooling ribs and the fluid is considered a cooling fluid.

The embodiments according to the invention of the substrate holder are preferably configured in such a manner that the ribs are located in an encapsulation, for example a housing. The encapsulation preferably has at least two access points. One of the access points is used for supplying the fluid, the second for drainage. As a result, it becomes possible to allow the fluid to flow over the ribs of the heat-conducting body continuously and above all spatially separately from the surroundings. Such a compact design also allows separation of the embodiment according to the invention from the components surrounding it. If the cooling is gas cooling, particularly cooling using air, a flow to the ribs by a gas flow, particularly an air flow, by means of a fan may already be sufficient in order to ensure efficient cooling. In a very particularly preferred embodiment, the cooling ribs are only cooled by the surrounding atmosphere.

The flow rate of the fluid can preferably be controlled. In this case, the flow rate is greater than 1 mm/s, preferably greater than 1 cm/s, even more preferably greater than 10 cm/s, most preferably greater than 1 m/s. The fluid can also be pressurised by means of a compact encapsulation. The pressure of the fluid in this case preferably corresponds to ambient pressure. However, the fluid can also be used under overpressure. Then, the pressure is greater than 1 bar, preferably greater than 2 bar, even more preferably greater than 5 bar, most preferably greater than 10 bar, absolutely most preferably greater than 20 bar. The supply of the fluid into the encapsulation and therefore to the ribs preferably takes place by means of hose systems, which were connected to the access points.

Optional Cooling and Heating Elements

In addition to the heat-conducting body considered below and the heat exchanger at its rear side, the substrate holder according to the invention can also have additional actively controllable cooling and/or heating elements. These additional cooling and/or heating elements are preferably built into the substrate holder according to the invention, particularly into the heat-conducting body. Attaching the cooling and/or heating elements on the periphery of the heat-conducting body in order to leave the heat-conducting body as homogeneous as possible and not to generate any thermal discontinuities due to additionally built-in components, would also be conceivable.

The heating element is preferably an induction heater. As the temperature compensation only has to take place for relatively small temperature differences however, it would also be conceivable to install infrared sources at the side of the heat-conducting body, which can be controlled more precisely, more quickly and more efficiently and can increase the temperature of the heat-conducting body in the range of a few degrees Celsius by means of radiant heat.

A cooling element could be additionally installed Peltier elements which enable an additional cooling of the substrate holder according to the invention, particularly of the heat-conducting body, independently of the actual heat-conducting body according to the invention. The Peltier elements are preferably attached outside of the heat-conducting body, so as to not destroy the material homogeneity of the heat-conducting body.

The heat-conducting body constitutes the actual aspect of the invention according to the invention.

The Heat-Conducting Body

The heat-conducting body is a component with a thermal mass which is as large as possible. The thermal mass is the product of the specific heat capacity and the mass of the body. In the case of a constant density distribution, one can replace the mass with the product of density and volume.

$$C_{th} = m * c_m = \rho * V * c_m$$

The term thermal mass is predominantly used in the engineering sciences. In the sciences, one mainly uses the more commonly used term, heat capacitance. The unit of heat capacitance is J/K. It is a measure for the ability of a body to store heat at a certain temperature. Bodies with a high heat capacitance are heat stores, which can be used as a buffer element.

Generally a temperature gradient falls by means of the heat-conducting body if the temperature Tk of the cooling fluid used differs from the temperature of the upper substrate. An average temperature may also be considered instead of the temperature gradient. The temperature gradient or the averaged temperature are designated with Tw in the remainder of the patent specification. The temperature of the cooling fluid is preferably kept constant during the process according to the invention, whilst the temperature gradient or the averaged temperature Tw generally changes. The temperature Tw preferably always corresponds to the temperature of the upper substrate and only marginally deviates from this.

It is an important discovery according to the invention that the temperature of the upper substrate and of the heat-conducting body according to the invention or the entire upper substrate holder according to the invention would correspond to the temperature of the cooling fluid, therefore particularly the ambient temperature, if the thermal resistance Rth4 between the two substrates were infinitely large. However, a heat flow from the lower substrate to the upper substrate is possible by means of a finite value of the thermal resistance Rth4.

According to the invention, it is primarily important that the temperature difference $\Delta T$, particularly during the temperature interval d, is known and above all can be set in a targeted manner, in order to minimise or preferably completely eliminate the "run-out" fault.

Because it is an object according to the invention of the embodiment according to the invention to dissipate the temperature at the substrate in as controlled a manner as possible, but also to stabilise the same in a correspondingly strong manner, the heat-conducting body has as high a heat capacitance as possible. The heat capacitance of the heat-conducting body is as large as possible, in order to enable efficient storage of the heat and to compensate thermal fluctuations as efficiently as possible respectively. The temperature stability is also reflected in the stability of the temperature difference $\Delta T$. For most solid bodies, at moderate temperatures and pressures, the heat capacitance at constant volume only differs marginally from the heat capacitance at constant pressure. Therefore, in the following no distinction is made between the two heat capacitances. Furthermore, specific heat capacitances are specified. The specific heat capacitance of the heat-conducting body is in particular greater than 0.1 kJ/(kg*K), preferably greater than 0.5 kJ/(kg*K), more preferably greater than 1 kJ/(kg*K), most preferably greater than 10 kJ/(kg*K), absolutely most preferably greater than 20 kJ/(kg*K). Given a known density and geometry of the heat-conducting body, the specific heat capacitances can be converted into the absolute heat capacitances using the formulae above.

Because the heat must be dissipated as quickly as possible, the heat-conducting-body material should have as high a thermal conductivity as possible. The thermal conductivity lies between 0.1 W/(m*K) and 5000 W/(m*K), preferably between 1 W/(m*K) and 2500 W/(m*K), more preferably between 10 W/(m*K) and 1000 W/(m*K), most preferably between 100 W/(m*K) and 450 W/(m*K). Copper, the construction material used most often for dissipating heat, has a thermal conductivity of approx. 400 W/(m*K) for example. The thermal conductivity is used to determine how much energy per unit time is transported via a path for a given temperature difference. The transported energy or amount of heat per unit time is termed the heat flow. The heat flow is more than 1 J/s, preferably more than 10 J/s, more preferably more than 100 J/s, most preferably more than 200 J/s, absolutely most preferably more than 500 J/s.

The heat-conducting body is preferably actively or passively cooled at its rear side. Passive cooling takes place by radiating the heat, particularly by means of a surface which is as large as possible. Active cooling takes place by means of a cooling fluid. The cooling fluid can be a gas or a liquid. The following would be conceivable for example liquids, particularly
    water
    oils
gases, particularly
    noble gases
        helium
        argon
    molecular gases
        HCFCs
        HFCs
        CFCs
        PFCs
        $CO_2$
        $N_2$
        $O_2$
    gas mixtures, particularly
        air, particularly
            ambient air The cooling fluids absorb the heat by means of the heat-conducting body, are heated thereby and at the same time cool the heat-conducting body. The heated cooling fluid is preferably circulated in a cooling circuit and emits the heat at a different point in the circuit system, is cooled again in the process and fed back to the cooling circuit. Preferably, cooling gases are used, because these are easier to handle. If the cooling fluid is ambient air, then the cooling takes place by emitting the heat from the heat-conducting body into the ambient air. The locally heated ambient air then propagates in the surrounding atmosphere and therefore leads to a temperature equalisation and cooling.

Due to the distribution of the heat over a larger surface area, the efficiency of the radiation or the heat transfer to the cooling fluid increases. The surface area can be enlarged even further, in that the roughness of the surface is consciously increased. In this case, the roughness is greater than 10 nm, preferably greater than 100 nm, more preferably greater than 1 µm, most preferably greater than 10 µm, absolutely most preferably greater than 100 µm.

Also conceivable is the use of a heat-conducting body without ribs, as a result of which the production of the heat-conducting body can be simplified.

In a further embodiment according to the invention, it would be conceivable to provide at least the upper side of the heat-conducting body with an open porosity. In this case the pore size should be greater than 100 nm, preferably greater than 1 µm, more preferably greater than 10 µm, most preferably greater than 100 µm, absolutely most preferably around 1 mm. The cooling fluid flows through the open porosity and in the process absorbs the heat even more efficiently due to the large surface area. It would also be conceivable to only provide the ribs with an open porosity in order to further increase the surface area of the ribs.

The main object of the substrate holder according to the invention, particularly of the heat-conducting body, is in temperature setting and temperature stabilisation of the substrate or temperature-difference setting and temperature-difference stabilisation between the lower and the upper substrate. The substrate holder according to the invention feeds heat to the substrate to this end and/or dissipates heat, depending on whether the substrate should be cooled and/or heated. The substrate holder according to the invention in particular allows a targeted setting of a maximum temperature or the temperature difference ΔT between the upper and the lower substrate and guarantees the temperature stability of the maximum temperature or the temperature difference ΔT for a time period, which is in particular equal to and more preferably is greater than the time period required for bonding the two substrates.

In the rest of the section, a plurality of implementations according to the invention are mentioned, which differ from one another by at least one feature. All of the embodiments according to the invention mentioned can be combined with one another arbitrarily and in such a manner that corresponding further embodiments according to the invention can be created, which combine a plurality of the features mentioned.

In an exemplary embodiment according to the invention, the substrate holder according to the invention has a separate fixing part, on which the heat-conducting body is placed. The heat-conducting body and fixing part are therefore two separate, but mutually connected components. A thermal coupling of the two components which is as efficient as possible takes place by way of surfaces which are as planar as possible. The roughness of the mutually contacted surfaces of the fixing part and the heat-conducting body respectively is in this case smaller than 100 µm, preferably smaller than 10 µm, more preferably smaller than 1 µm, most preferably smaller than 100 nm, absolutely most preferably smaller than 10 nm. A further improvement of the thermal transfer can take place by means of the use of thermal conductive pastes.

In a different preferred embodiment, the fixing surface is constructed in one piece with the heat-conducting body. In other words: the heat-conducting body itself is realised as a fixing part. The heat-conducting body and the fixing part or the fixing surface are realised in one piece. The substrate holder may have yet further components which are not considered, shown or described further however, because they do not decisively influence the functionality of the invention. An improved heat conduction is possible by means of this embodiment according to the invention, because no boundary surfaces are present between the fixing part and heat-conducting body.

Because the embodiment according to the invention of the integral or one-piece heat-conducting body is the optimum embodiment according to the invention, all variations in the following are referred to this basic type. Fixing part and heat-conducting body are therefore used synonymously in the text below.

In a different, particularly preferred embodiment according to the invention, the substrate holder has at least one, in particular movable, preferably drivable, deformation element for deforming the substrate, wherein the at least one deformation element is preferably arranged centrally in the substrate holder. The at least one deformation element can in particular be movable, particularly drivable, perpendicularly to the fixing surface or to the fixed substrate. The at least one deformation element is preferably constructed in such a manner that the substrate can be deformed away from the fixing surface. The substrate holder or heat-conducting body can have an, in particular centrally installed and/or continuously running, hole, in which hole the at least one deformation element is arranged in an in particular movable, preferably drivable, manner or which hole allows the access of the at least one deformation element, using which the fixed substrate can be deformed. The at least one deformation element is for example a pin
    a rod
    a ball
    a nozzle, particularly
        a gas nozzle The deformation element is operated or controlled in such manner that it is able, by means of targeted control, to deform the substrate at least locally, preferably centrally. The deformation in this case is preferably concave when viewed from the side of the deformation element. The deformation is used in particular for the process of separating the substrate from the fixing part or from the fixing surface.

In a further embodiment according to the invention, eat-conducting body has at least one recess and/or depression in the fixing surface, in order to ensure as little contact as possible of the substrate with the fixing surface or with the material of the heat-conducting body. As a result, what is known as the effective fixing surface is reduced. The effective fixing surface is the area of the fixing surface which is actually in contact with the substrate. Preferably at least one recess is arranged in the fixing surface, so that the substrate can be kept spaced from the fixing surface. The advantage of this embodiment according to the invention is the fact that contamination of the substrate due to the surface of the heat-conducting body is decreased. In order to carry out the heat transfer efficiently, a gas with correspondingly high thermal conductivity and correspondingly high heat capacitance can be introduced, particularly flowed, into the at least one recess and/or depression. The substrate is then only fixed at a few fixing elements, particularly at the periphery and/or in the centre. An embodiment of this type is disclosed in the published document WO2013/023708A1, the disclosure content of which is explicitly included in the disclosure content of this application with regards to this embodiment.

In a further embodiment according to the invention, nub-shaped (nubs) and/or needle-shaped and/or pedestal-shaped elements are arranged in the at least one depression, so that the substrate can be kept spaced from the fixing surface by means of these elements, which taper in the direction of the substrate in particular. The elements reach as far as the surface of the heat-conducting body and support the fixed substrate. In order to ensure the heat coupling between the first substrate and the heat-conducting body, in this embodiment according to the invention also, a flushing of the intermediate spaces of the nubs and/or needles and/or pedestal with a fluid of high heat capacitance is possible.

Fixing Elements

All disclosed embodiments according to the invention are able to fix a substrate, particularly a wafer, more preferably a semiconductor wafer. The fixing can in this case take place by means of any desired fixing element. Preferably, fixing elements for fixing the substrate are arranged, particularly over the entire area, in, at and/or on the fixing surface. The following would be conceivable

- vacuum fixings
- electrostatic fixings
- magnetic fixings
- mechanical fixings, particularly
  - clamps
- adhesion fixings, particularly
  - fixings by means of adhesive films Vacuum fixings or vacuum paths (also termed vacuum channels in the following), arranged in a distributed manner over the entire area of the fixing surface in particular, are particularly preferred. The vacuum fixing comprises a plurality of vacuum channels which end in vacuum openings on the fixing surface of the substrate holder.

In a different embodiment according to the invention, the vacuum channels are connected to one another so that an evacuation and/or flushing of the vacuum channels can take place at the same time.

In a different embodiment according to the invention, at least individual vacuum channels are connected to one another and form corresponding vacuum channel groups. Each vacuum channel group can be individually controllable in this case, so that step-by-step fixing and/or separation of the substrate can be achieved. In particular embodiments according to the invention, a plurality of vacuum openings are arranged in a plurality of centred circles, which differ in terms of their radius, to form a vacuum-channel group. Advantageously, all vacuum channels of the same circle are controlled at the same time, so that the fixing and/or separation of the substrate can begin centrally and be controlled progressing outwards in a radially symmetrical manner. This results in a particularly efficient possibility for controlled fixing and/or separation of the substrate.

Thermal Resistance: Equivalent Circuit Diagram

A further important aspect of the invention according to the invention in particular is an optimisation of the heat flow through the substrate holder according to the invention. The heat flow between the heat source and heat sink is decisively influenced by the thermal resistances, Each static many-particle system, therefore fluids such as gases and liquids, and solid bodies, has a thermal resistance. The person skilled in the art knows the definition of thermal resistance. The thermal resistance is not a purely material parameter. It depends on the thermal conductivity, the thickness and the cross section.

$$R = \frac{d}{A * \lambda}$$

In the remainder of the published document, it is assumed that the heat flow always flows through the same cross section, so that the thermal resistance, at constant cross section, is to be considered as a function of the thermal conductivity and the thickness of the respectively considered material. The thermal resistance is abbreviated in the figures with Rth and an index. According to the invention, there are eight relevant thermal resistances in particular. Rth1 to Rth8 are the thermal resistances of the (i) lower substrate holder, (ii) of the fluid or vacuum between the lower substrate holder and the lower substrate, (iii) of the lower substrate, (iv) of the fluid or vacuum between the two substrates, (v) of the upper substrate, (vi) of the fluid or vacuum between the upper substrate and the upper substrate holder, (vii) of the heat-conducting body and (viii) of the fluid which flows between the cooling ribs in particular.

The heat flow is directly proportional to the applied temperature difference between the heat source and the heat sink. The thermal resistance is the constant of proportionality. The following is therefore $$R = \frac{1}{\Delta T} * \frac{dQ}{dt}$$

It is a further important aspect of the invention according to the invention in particular, to minimise the thermal resistances above and/or below the substrates and to maximise the thermal resistance between the substrates. According to the invention, the thermal resistances are therefore to be configured as follows in particular:

- Rth1 is minimised, particularly by choosing a material with high thermal conductivity,
- Rth2 is minimised, particularly by choosing a fluid with high thermal conductivity,
- Rth3 should be minimised by choosing a substrate with a high thermal conductivity,
- Rth4 is maximised, particularly by flushing with a gas of low thermal conductivity and/or a vacuum and/or by means of optimised process management, particularly by means of a skilled choice of the distance,
- Rth5 should be minimised by choosing a substrate with a high thermal conductivity,
- Rth6 is minimised, particularly by choosing a fluid with high thermal conductivity,
- Rth7 is minimised, particularly by choosing a material with high thermal conductivity, and/or
- Rth8 is minimised, particularly by choosing a fluid with high thermal conductivity.

It is an important aspect of the embodiment according to the invention in particular to be able to set the temperature of the upper substrate or the temperature difference $\Delta T$ between the lower substrate and the upper substrate in a targeted manner and to keep the same as constant as possible during the bonding process. This takes place according to the invention by means of a correct choice of the thermal resistances. By maximising the thermal resistance Rth4, the heat flow from the lower substrate to the upper substrate is minimised, preferably even interrupted completely. However, because a complete interruption of the heat flow is practically unachievable, it will practically always result in a temperature change of the upper substrate. The temperature difference $\Delta T$ is in particular smaller than 20° C., preferably smaller than 10° C., more preferably smaller than 5° C., most preferably smaller than 1° C., absolutely most preferably smaller than 0.1° C.

On the other hand it should be possible in particular for the temperature of the lower substrate to be set exactly by means of a heating device in the lower substrate holder. In particular, the temperature of the lower substrate should correspond to the temperature of the lower substrate holder. The lower substrate holder is tempered in particular to temperatures below 100° C. preferably below 75° C. more preferably below 50° C., most preferably below 30° C.

Furthermore, the temperature of the upper substrate should in particular correspond to the temperature of the cooling fluid and/or the heat-conducting body. In a very particular embodiment according to the invention, the temperature of the cooling fluid principally corresponds to the ambient temperature. That is the case in particular if the atmosphere itself is used as cooling fluid. The cooling fluid is tempered in particular to temperatures below 100° C., preferably below 75° C., more preferably below 50° C., most preferably below 30° C. In a very particular embodiment according to the invention, the ambient atmosphere is used as cooling fluid and therefore has room temperature or ambient temperature.

The diameter of the substrates cannot be changed. The thermal conductivities and thicknesses of the substrates used are for the most part likewise predetermined by production conditions and therefore for the most part also cannot be called upon for optimisation according to the invention. By means of the correct choice of the thermal resistances according to the invention, the heat flow from the lower substrate to the upper substrate in particular is preferably minimised and the heat flow from the upper substrate to the cooling fluid is maximised. Thus, the temperature difference $\Delta T$ remains constant according to the invention.

A further aim of the choice of the thermal resistances according to the invention in particular primarily is in keeping the temperature of the upper substrate constant, particularly at ambient temperature, and therefore to minimise the influence due to other heat sources, particularly the heat source of the lower substrate. At a temperature of the lower substrate holder, and therefore of the lower substrate, which is kept constant, this is synonymous with maintaining the temperature difference $\Delta T$ between the upper and the lower substrate, particularly during the bonding process in the temperature range d. This principally takes place by maximising the thermal resistance Rth4 between the substrates. By contrast, it should be possible to regulate the temperature T1$u$ of the lower substrate as efficiently as possible by means of a heating device. In this case, the temperature of the lower substrate holder is designated with Tp. Preferably, the temperature Tp of the lower substrate holder is identical to the temperature T1$u$ of the lower substrate at any point in time. The transfer of the heat from the heater to the lower substrate principally takes place by means of a minimisation of the thermal resistances Rth1 and Rth2.

Processes

The method according to the invention or the processes according to the invention can be described on the basis of what are known as temperature/time graphs. In the temperature/time graphs, a temperature, particularly the temperature T at the substrate, which is fixed to the substrate holder according to the invention, is in particular illustrated as a function of the time t (temperature graph). In this case, the temperature is shown on the ordinate at the left edge of the temperature/time graph. A distance/time curve can also be illustrated (distance graph) in the temperature/time graphs, from which it is possible to read how large the distance of the two substrates from one another is at a point in time. In this case, the ordinate of the distance/time curve is shown at the right edge of the temperature/time graph. Because the distance/time curve shows distances from the mm down to the nm range, it is preferably scaled logarithmically. For the sake of clarity, the distance/time curve is only illustrated in the figures with a linear scale however. For the sake of simplicity, only a temperature/time graph or for brevity a T-t graph is spoken of in the following. In addition to the T-t graph for the fixed substrate, a T-t graph could also be described for the substrate holder according to the invention. However, the two T-t graphs only differ marginally, particularly with reference to minimum deviations along the temperature axis from one another. In the remainder of the patent specification, T-t graphs are therefore used synonymously for temperature/time graphs of the fixed substrate and/or the substrate holder according to the invention. This assumption is above all justified if the thermal resistances Rth2 and Rth6 are minimal. In this case, the thermal coupling between the substrate holder and the substrate is so good that one can assume that the temperatures thereof are more or less identical.

Each graph can generally be divided into six sections, particularly time sections.

In the first, initial section a, the substrate is brought closer from a relatively large distance. In section a, the distance between the two substrates is greater than 1 mm, preferably greater than 2 mm, more preferably greater than 3 mm, most preferably greater than 10 mm, absolutely most preferably greater than 20 mm. A movement of the substrate within the section a does not lead to a temperature increase due to the other, in particular lower, second substrate or the other, in particular lower, second substrate holder, which can generally be heated to a temperature above room temperature. If the distance between two substrates is reduced to the extent that influence due to heat radiation of the second, lower substrate or the second, lower substrate holder and/or the heat convection of the surrounding gas at the upper, first substrate takes place, there is a moderate temperature increase at the upper, first substrate.

This region b of the moderate temperature increase is termed the coarse approach region. The distance of the two substrates here lies between 10 mm and 0 mm, preferably between 5 mm and 0 mm, more preferably between 1 mm and 0 µm, most preferably between 100 µm and 0 µm.

If the substrates are brought closer together, there is an abrupt increase of the temperature of the upper, first substrate at the end of the coarse approach region b. A type of heat coupling takes place between the two substrates. Due to the small distance/diameter ratio of substrate distance to substrate diameter, the heat leads to heating of the upper, first substrate. The surrounding gases heated by heat radiation can no longer diffuse out of the intermediate space of the two substrates quickly enough and therefore transmit the heat preferably directly from the lower, second substrate to the upper, first substrate. Similar considerations apply for heat radiation, which practically only additionally has the option to reach the surface of the upper, first substrate. This region of strong heating of the substrate is termed the close approach region c. The distance of the two substrates here lies between 1 mm and 0 mm, preferably between 100 µm and 0 µm, more preferably between 10 µm and 0 µm, most preferably between 1 µm and 0 µm.

The transition of the temperature profile from the close approach region c to what is known as a temperature saturation region d preferably takes place by means of a transition which in mathematical terms is as steady as possible, but cannot be differentiated. It is also conceivable that the transition takes place continuously, so that a separation of the regions c and d cannot be undertaken unambiguously. The shape of the temperature/time graph then looks like a "shark fin". Different shapes would also be conceivable however.

The bonding process according to the invention preferably takes place in the temperature saturation region d. The translational bringing together of the substrates is stopped, that is to say the distance between the substrates remains constant. At this time, the upper, first substrate has a constant temperature $T4o$ for a well-defined time period $t1$ which corresponds to the length of the temperature saturation region d. A constant temperature $T4o$ means a maximum temperature fluctuation of a maximum of 4 K, preferably a maximum of 3 K, further preferably a maximum of 2 K, most preferably a maximum of 1 K, absolutely most preferably a maximum of 0.1 K. The distance of the two substrates is constant in this region and lies between 1 mm and 0 mm, preferably between 100 µm and 0 µm, more preferably between 10 µm and 0 µm, most preferably between 1 µm and 0 µm. In special embodiments according to the invention, a further bringing together of the two substrates in the region d would also be additionally possible. However, it is to be ensured then that there is still sufficient time remaining for the actual bonding process. Furthermore, the temperature difference $\Delta T$ between the lower and the upper substrate remains constant in the temperature saturation region d. The fluctuations of the temperature difference $\Delta T$ are in this case smaller than 4 K, preferably smaller than 3 K, more preferably smaller than 2 K, most preferably smaller than 1 K, absolutely most preferably smaller than 0.1 K. The temperature difference $\Delta T$ can in particular be set exactly and reproducibly by choosing the thermal resistances and/or the heat sources, particularly the heater in the lower substrate holder, and/or the heat sinks, particularly the cooling fluid.

In particular, it is provided that the time period $t1$, during which the constant temperature $T4o$ is set at constant distance $d3$, is more than 5 seconds, preferably more than 10 seconds, further preferably more than 15 seconds, even further preferably more than 20 seconds, most preferably more than 40 seconds. As a result, sufficient time advantageously remains for the bonding process.

Furthermore, it is provided in particular that the time period $t1$, the distance $d3$ and/or the constant temperature $T4o$ are determined before the first step, particularly empirically, preferably taking account of the temperature of the second substrate, the materials of the substrate holder, the heat-conducting bodies and/or the substrates and/or the approach speed. Thus, it is in particular advantageously possible to determine or to calibrate the method before the first step in such a manner that the optimum parameters of the method can be determined.

The bonding process, particularly the fusion bonding process, requires a time period $t2$, which is in particular smaller than or equal to the time period $t1$. It is an important aspect according to the invention that the bonding process preferably takes place inside the time period of the temperature saturation region d at the given temperature $T4o$. This has the advantage that the bonding process can take place without the temperature of the first substrate changing, as a result of which the above-described run-out faults can be prevented and at least reduced.

In the subsequent cooling region d, the upper, first substrate cools, particularly exponentially.

In the subsequent region f, a constant saturation temperature is finally set, which is higher than the initial temperature of the upper, first substrate in the first section a before the process of bringing together. However, it is generally lower than the temperature of the lower, second substrate or substrate holder. It would also be conceivable to carry out a bonding process in the region f at the temperature $T6o$.

Preferably, all necessary physical parameters, which make it possible to draw an exact conclusion about the temperature/time graphs, are established before the use of the method according to the invention. The method according to the invention must be changed by varying the physical parameters until it has been ensured that the temperature/time profile arising during the actual bonding process is precisely the one which allows an optimal bonding of both substrates to one another and above all also leads to a corresponding throughput. By using a corresponding heat-conducting body according to the invention with the corresponding thermal mass, the correct cooling fluid, the correct cooling fluid pressure, the correct cooling fluid flow rate, a correct approach profile, etc., the saturation temperature $T4o$ in the region d, the time period $t1$ of the region d and all other desired regions of the temperature/time graphs can be set accordingly.

Once the system has been calibrated for a temperature/time behaviour, it is also ensured that the upper, first substrate has a well-defined temperature at a well-defined point in time and that starting from when this temperature is reached, a well-defined time is available in order to carry out the actual bonding process by means of bending and/or detachment of the fixing, which is in particular caused by means of a vacuum. Two fundamentally important aspects of the invention result from the possibility of bonding as soon as early in the region d. First, it is possible to start with the bonding early, which leads to an immense increase in throughput and second, it is ensured that the substrate has an extremely constant temperature within a well-defined time period. As a result, it becomes possible according to the invention to completely prevent the run-out problems which are very well known in the prior art. It is ensured that both substrates have a practically constant temperature during the time period of the region d and practically do not change their temperature during the bonding process. In this context, it should be mentioned again explicitly that the above circumstance of constant temperature does not mean that both substrates have to have the same temperature. It may very well be desired to heat or to cool at least one of the two substrates to a higher or lower temperature in advance, in order by means of a desired, forced thermal expansion, to set a desired, forced substrate size, which first leads to a congruence of the two functional units of the two substrates. It is in accordance with the invention however to keep these temperatures constant, once set, during the bonding process.

In each method described, the substrates can be pre- and/or post-treated. The following are considered primarily as pre-treatment cleaning, particularly by means of
    chemical processes, particularly by means of
        liquids, particularly by means of
            water
    physical processes, particularly by means of
        sputtering, particularly by means of
            ions, particularly by means of
                plasma activation
            uncharged particles
grinding
polishing
alignment, particularly
    mechanical alignment and/or
    optical alignment
depositions The following are considered as post-treatment cleaning, particularly by means of
    chemical processes, particularly by means of
        liquids, particularly by means of
            water
    physical processes, particularly by means of
        sputtering, particularly by means of
            ions
            uncharged particles
grinding
polishing
investigations, particularly
    of the bond interface, particularly
        for voids
        for alignment faults, particularly
            run-out faults
heat treatments, particularly
    in an oven
    on a heating plate
renewed separation of the substrates, particularly by means of the methods from the published document WO2013/091714A1

Above all, a compensation of the run-out fault known in the prior art is enabled by means of the embodiment according to the invention. In order to ensure that the alignment accuracy was minimised to a sufficient extent, an investigation of the bond interface after the bonding of both substrates is therefore particularly important in order, if appropriate, to separate the substrates from one another again by means of a specific method, particularly the method from the published document WO2013/091714A1. Therefore, a loss of both substrates or the entire substrate stack is prevented and the substrates can, if required, be realigned with respect to one another and bonded.

The alignment accuracy that can be achieved by means of the system according to the invention or the process according to the invention is better than 100 μm, preferably better than 10 μm, more preferably better than 500 nm, most preferably better than 200 nm, absolutely most preferably better than 100 nm. The alignment accuracy is the same at every position of the substrate stack in particular, which is a decisive and characteristic feature of a successful run-out fault compensation. The standard deviation of the alignment accuracy, which is determined by averaging all alignment faults of the substrate stack, is in this case smaller than 1 μm, preferably smaller than 500 nm, more preferably smaller than 250 nm, most preferably smaller than 100 nm, absolutely most preferably smaller than 50 nm.

After the bonding process according to the invention and an optional, but preferred positive investigation, the substrates are heat-treated insofar as this is necessary. The heat treatment is necessary for fusion bonded substrates in particular. In this case, the heat treatment leads to the generation of a permanent bonding of both substrates which can no longer be broken. If heat treatments of the substrates are no longer necessary after the bonding process according to the invention, this is correspondingly dispensed with.

In a Method according to the invention, the bonding of the two substrates takes place in the region d by deforming a, particularly the upper, first substrate. The deformation preferably takes place centrally by means of the deformation element which has already been described. The advantage of the first process according to the invention primarily is in the throughput. Because the bonding process already takes place in section d and it is not necessary to wait for the cooling of the upper, first substrate, the throughput (therefore the number of substrates which can be processed per unit time using the embodiment according to the invention) can be increased compared to the prior art. The cooling of the upper, first substrate is the process of adaptation to the ambient temperature which is primarily predetermined by the surrounding atmosphere and/or the lower, second substrate or the lower second substrate holder.

In a different process according to the invention, the bonding of the two substrates takes place in the region f by deforming a, particularly the upper, first substrate. The deformation preferably takes place centrally by means of the deformation element which has already been described.

The temperatures $T4o$, $T6o$ can be varied and optimally adjusted by means of the substrate holder according to the invention, particularly by means of the thermal mass, the cooling elements and devices, the cooling processes, the cooling fluids, etc.

Further advantages, features and details of the invention result from the following description of preferred exemplary embodiments, as well as on the basis of the drawings.

BRIEF DESCRIPTION OF THE DRAWINGS

In the figures, the same components or components with the same function are labelled with the same reference numbers.

DETAILED DESCRIPTION OF THE INVENTION

Figure 1:
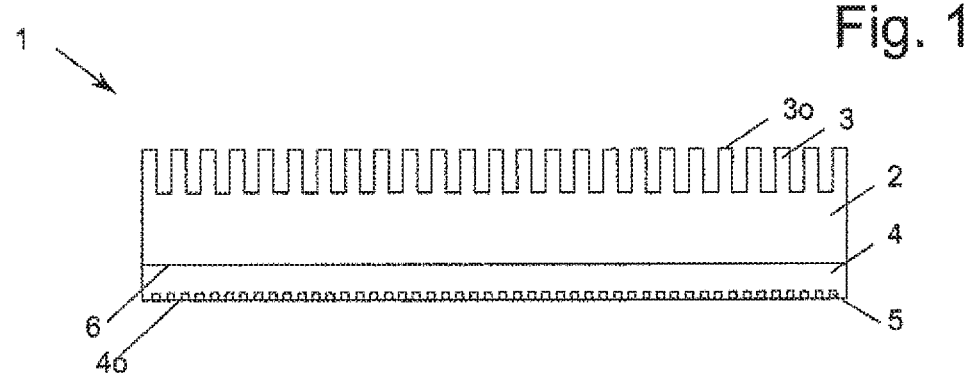
FIG. 1 shows a schematic cross-sectional illustration, which is not true to scale, of a first embodiment according to the invention of a substrate holder.

The FIG. 1 shows a first embodiment according to the invention of a substrate holder 1, having a fixing part 4 and a heat-conducting body 2. The fixing part 4 has fixing elements 5, particularly vacuum paths, more preferably individually controllable vacuum paths, with the aid of which a first substrate 11, which is not illustrated, can be fixed on a fixing surface 4o. The heat-conducting body 2 preferably has a plurality of ribs 3, which can emit heat to a fluid, which is not illustrated, via the rib surface 3o thereof. The heat-conducting body 2 is connected to the fixing part 4 via a boundary surface 6.

Figure 2:
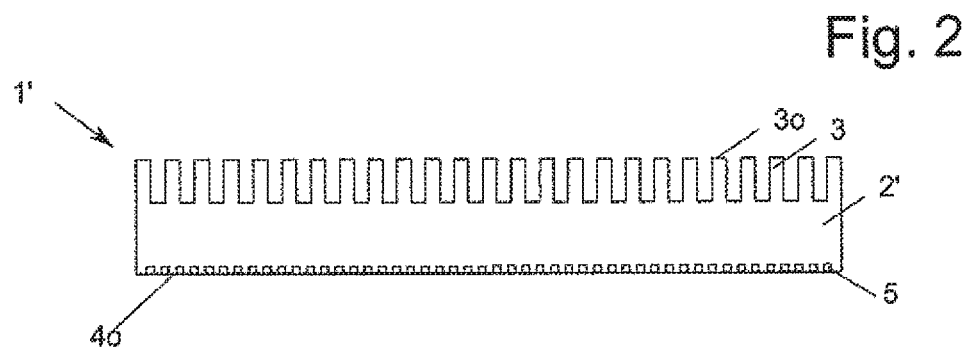
FIG. 2 shows a schematic cross-sectional illustration, which is not true to scale, of a second embodiment according to the invention.

FIG. 2 shows a second, preferred embodiment according to the invention of a substrate holder 1' according to the invention, having a heat-conducting body 2' which also functions as a fixing part at the same time. In other words: the heat-conducting body 2' and the fixing part are—by contrast with the embodiment from FIG. 1—constructed in one-piece, i.e. integrally. As a result, there is no boundary surface between the fixing part and the heat-conducting body 2', so that advantageously there is no thermal barrier which hinders the dissipation of the heat from the first substrate 11, which is not illustrated, to the fluid (not illustrated) flowing around the ribs 3.

Figure 3:
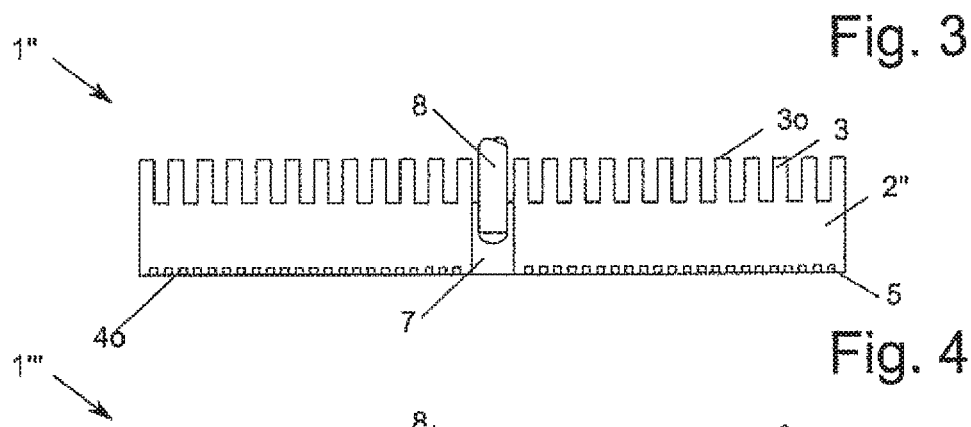
FIG. 3 shows a schematic cross-sectional illustration, which is not true to scale, of a third embodiment according to the invention.

FIG. 3 shows a third, even more preferable embodiment according to the invention of a substrate holder 1" according to the invention, which has a hole 7 in the heat-conducting body 2". The hole 7 allows the access of a deformation element 8, particularly a rod to the rear side 11o, which is not illustrated, of a substrate 11 which is not illustrated. Otherwise, this embodiment corresponds to that from FIG. 2, so reference is made to the description for that figure.

Figure 4:
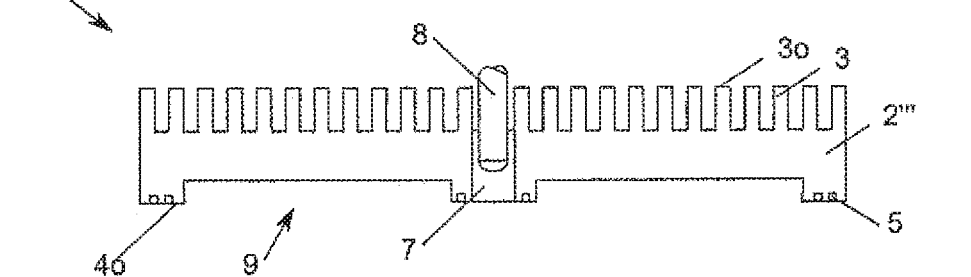
FIG. 4 shows a schematic cross-sectional illustration, which is not true to scale, of a fourth embodiment according to the invention.

FIG. 4 shows a fourth embodiment according to the invention of a substrate holder 1''' according to the invention, which—in addition to the features mentioned in FIG. 3—also has depressions 9 in the fixing surface 4o, in order to minimise the contact between the rear side, which is not illustrated, of the first substrate 11, which is not illustrated. This minimisation serves to prevent, particularly metallic, contamination of the substrate by the fixing surface 4o. Furthermore, it serves to prevent local deformation of the substrate by particles. To increase the heat coupling, the depressions 9 can be flooded with fluids of high heat capacitance and/or thermal conductivity.

Figure 5:
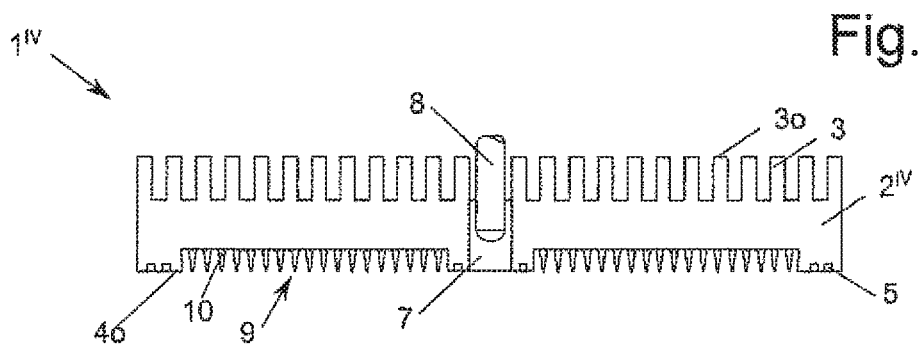
FIG. 5 shows a schematic cross-sectional illustration, which is not true to scale, of a fifth embodiment according to the invention.

FIG. 5 shows a fifth embodiment according to the invention of a substrate holder $1^{IV}$ according to the invention, which—in addition to the features mentioned in FIG. 3—has depressions 9 which are filled with nubs and/or needles and/or pedestals 10, in order to minimise the contact between the rear side, which is not illustrated, of the first substrate 11', which is not illustrated, and to ensure a supporting of the first substrate 11 over the entire area to the greatest extent possible. This minimisation likewise serves the prevention of, particularly metallic, contamination. The depressions 9 can be flooded with fluids of high heat capacitance and/or thermal conductivity to increase the heat coupling.

Figure 6A:
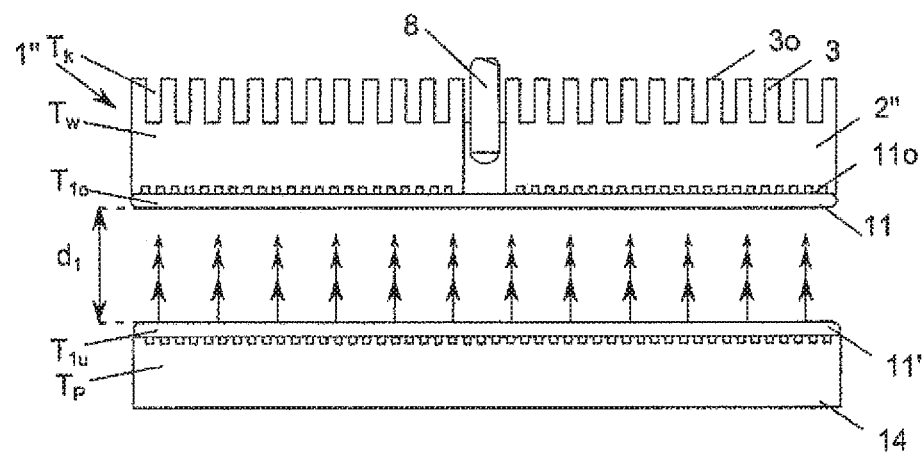
FIG. 6a shows a schematic cross-sectional illustration, which is not true to scale, of a first step of a method according to the invention.
Figure 6B:
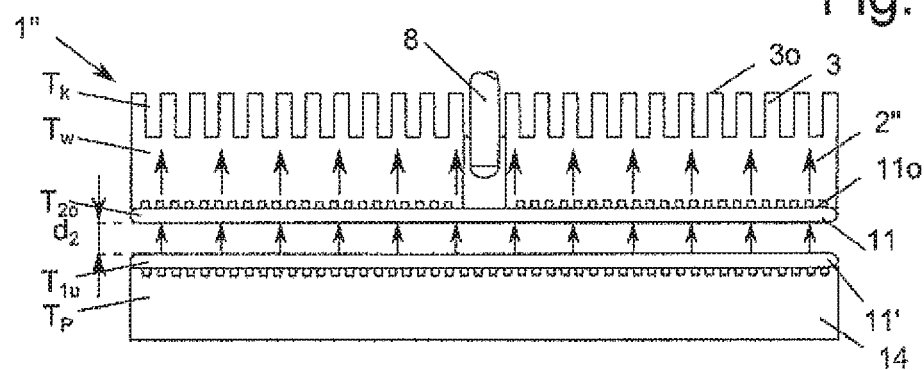
FIG. 6b shows a schematic cross-sectional illustration, which is not true to scale, of a second step.
Figure 6C:
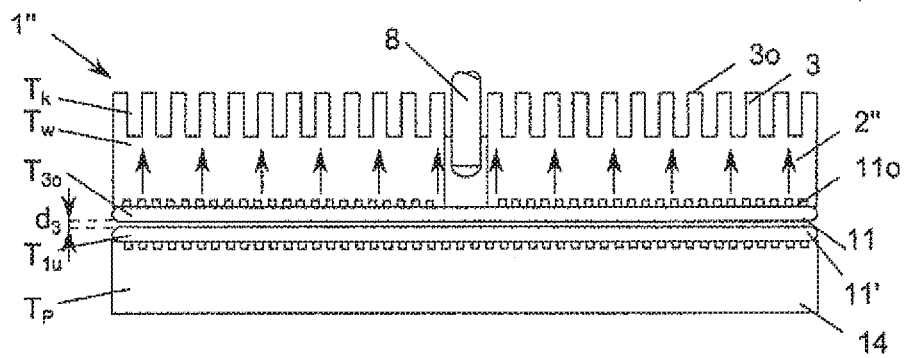
FIG. 6c shows a schematic cross-sectional illustration, which is not true to scale, of a third step.

FIG. 6a shows a first step of an exemplary method according to the invention, wherein initially a first, upper substrate 11 is at a distance d1 from a second, lower substrate 11'. This process step takes place in the region a, which has already been defined previously, of the associated T-t graph. The substrates 11, 11' approach one another, wherein the thermal influencing of the upper, first substrate 11 by the lower, second substrate 11' or a lower substrate holder 14 is excluded to the greatest extent possible due to the relatively large distance, as already described above.

The bringing together of the two substrates 11, 11' to a distance d2 takes place in a subsequent step. At this point in time, the system is in the region b, which has already been defined previously, the so-called coarse approach region, in which a relatively slight heating of the upper, first substrate 11 takes place already, particularly by means of the heat radiation of the lower substrate 11'.

In a subsequent step, the two substrates 11, 11' approach one another further to a well-defined distance d3, as already described above. At this point in time, the system is in the region c, which has already been described previously, the so-called close approach region, in which an abrupt heating of the upper, first substrate 11 takes place, particularly by means of heat radiation and heat convection.

Figure 6D:
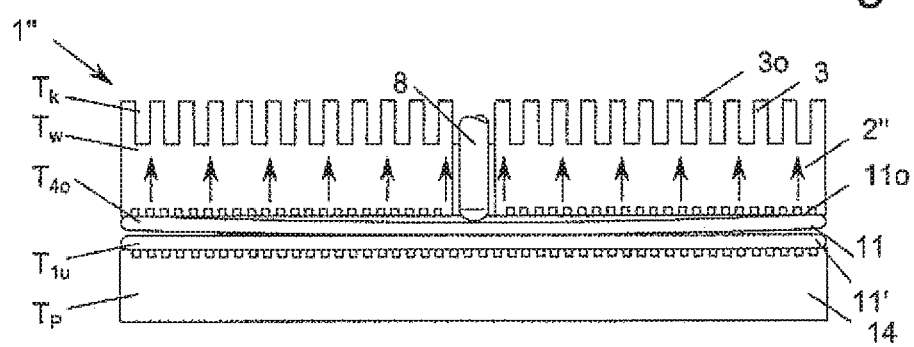
FIG. 6d shows a schematic cross-sectional illustration, which is not true to scale, of a fourth step.

The bonding process of the two substrates 11, 11' takes place in a subsequent step according to FIG. 6d. The substrates 11, 11' are constantly at a distance d3. At this point in time, the substrates 11, 11' are in the region d, which has already been described previously, the so-called bonding region, in which the temperature T4o is constant for a time period t1.

Figure 6E:
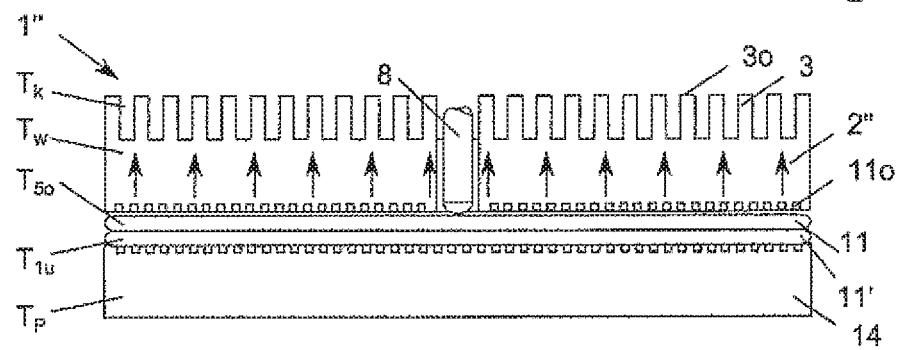
FIG. 6e shows a schematic cross-sectional illustration, which is not true to scale, of a fifth step.

In a subsequent step according to FIG. 6e, the cooling of the substrate 11 and/or 11' takes place in the region e, which has already been described previously. The cooling is in turn a process of adaptation of the temperature of the upper, first substrate 11 to the ambient temperature, particularly the temperature of the surrounding atmosphere and/or of the lower, second substrate 11' or lower substrate holder 14. The connection of the two substrates 11, 11' already took place at this point in time however, particularly by means of a pre-bond.

Illustration of the region f, which has already been described previously, by means of a further figure is dispensed with, because no important insights can be gained therefrom. As has already been disclosed in the text of the description, the bonding process could also take place in the constant temperature region in region f.

Figure 7A:
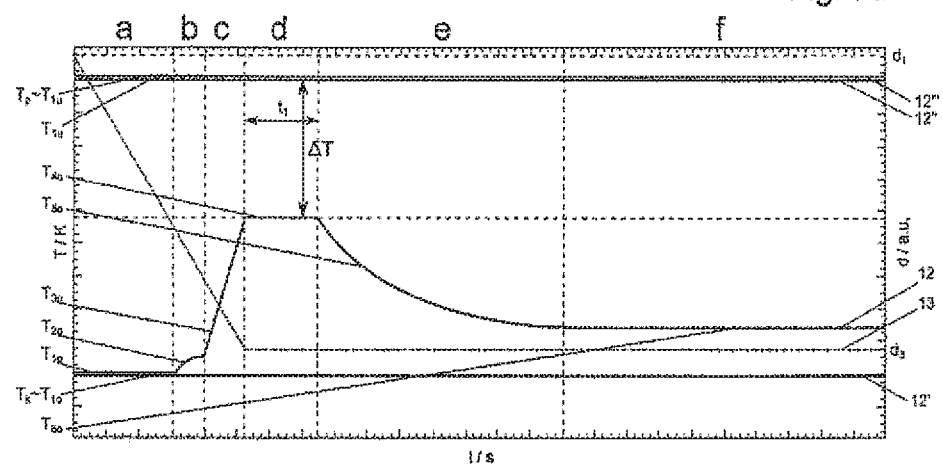
FIG. 7a shows a schematic illustration of a first temperature/time and distance/time graph.

FIG. 7a shows a temperature/time graph, which has already been described previously, with the six characteristic temperature regions a, b, c, d, e, f, which have already been described previously and are marked on the upper horizontal axis. The time t is marked in seconds on the lower horizontal axis; the temperature T is entered in Kelvin on the left vertical axis The un-scaled distance d (a.u.) between the two substrates 11 and 11' is entered on the right vertical axis. Furthermore, four temperature graphs 12, 12', 12" and 12'" are plotted. The temperature graph 12 represents the temperature of the first substrate 11. The temperature graph 12' represents the temperature of the heat-conducting body 2, 2', 2", 2'", $2^{IV}$, which more or less matches the temperature Tk of the cooling fluid. Before the bringing together of the two substrates 11, 11', it also approximately matches the temperature T1o of the upper substrate 11. The temperature graph 12" represents the temperature of the second substrate 11'. The temperature graph 12'" represents the temperature of the lower substrate holder 14. If the thermal coupling between the second substrate 11' and the lower substrate holder 14 is large enough, these two temperatures are virtually identical.

A distance graph 13 is also marked, which specifies the distance d between the two substrates 11 and 11'. The distance graph 13 is to be interpreted symbolically exclusively and will in reality show a softer transition from region c to the region d, because the substrates have to be negatively accelerated, that is to say decelerated. In particular, the substrates can also change their speed in the approach phase. The temperature difference ΔT between the temperature of the lower substrate and the temperature of the upper substrate in the temperature saturation region d can be set exactly and reproducibly by means of the thermal resistances and/or the heat source, particularly a heater in the lower sample holder 14, and/or a heat sink, particularly the cooling fluid.

The curves of the temperature graph 12 and the distance graph 13 during an exemplary method according to the invention show the following: At the start of the method, i.e. at the far left on the time-scale in the region labelled a (the so-called temperature region a), the two substrates 11, 11' are brought closer to one another, so that the distance d between the substrates 11, 11' is reduced. At the beginning of the method, the distance between the two substrates 11, 11' is d1, which is successively reduced. In the temperature region a, the temperature of the first or upper substrate 11 is practically constantly T1o.

As seen temporally, the temperature region a is followed by the temperature region b, in which the temperature of the substrate 11 increases relatively slightly (temperature curve section T2o), whilst the distance d between the substrates 11, 11' is reduced further.

As seen temporally, the temperature region b is followed by the temperature region c, in which the temperature of the substrate 11 increases relatively strongly compared to the temperature region b (temperature curve section T3o), whilst the distance d between the substrates 11, 11' is reduced further. The final practically constant distance d between the substrates 11, 11' is reached at the end of the temperature region c.

The temperature region c is followed by the temperature region d, in which the distance d remains constant and the temperature T4o of the first substrate 11 is practically constant. The same is true for the temperature difference ΔT between the lower substrate 11' and the upper substrate 11. This constant temperature T4o is maintained for a time period t1. It is to be pointed out in particular that the transition from temperature region c (so-called close approach region c) to the temperature region d (so-called bonding region d) takes place abruptly.

The temperature region d is followed by the temperature region e, in which the temperature of the substrate 11 drops (temperature curve section T5o), whilst the distance d remains practically constant. In the subsequent temperature region f, there is a practically constant temperature of the substrate 11 (see temperature curve section T6o).

Figure 7B:
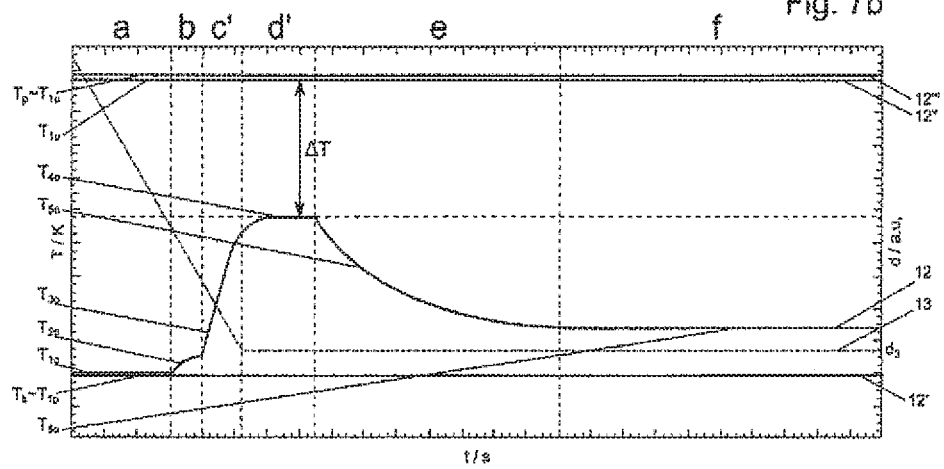
FIG. 7b shows a schematic illustration of a second temperature/time and distance/time graph.

FIG. 7b shows a different temperature/time graph, with the six characteristic temperature regions a, b, c', d', e, f, which have already been defined previously. The distance graph 13 is identical to that from FIG. 7a. The temperature graph 12 corresponds to that from FIG. 7a in temperature regions a, b, c, f, so for these regions, reference is made to the explanations for FIG. 7a. The difference from FIG. 7a is found in the regions c' and d' compared to the regions c and d in FIG. 7a. In this example, the transition from the close approach region c' to the bonding region d' does not take place abruptly as in FIG. 7a, but rather continuously.

Figure 8:
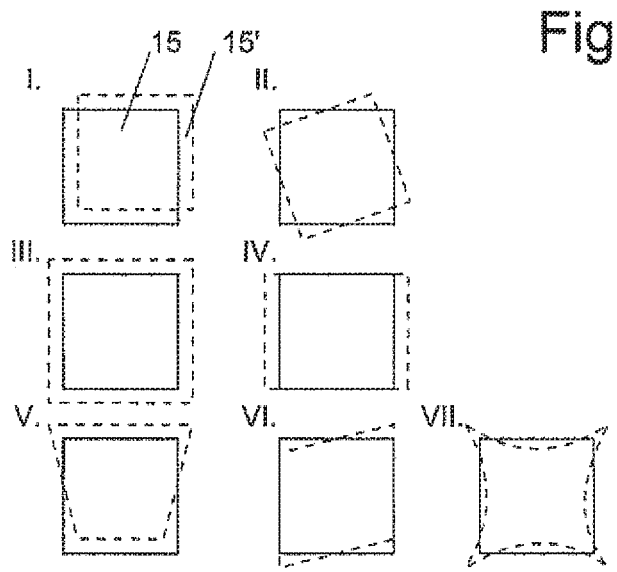
FIG. 8 shows a schematic illustration of possible overlay faults and FIG. 9 shows a schematic illustration of a thermal equivalent circuit diagram.

In the images I. to VII., FIG. 8 shows a plurality of possible overlay faults, which have already been mentioned or defined above, between upper structures 15 of an upper substrate 11 and lower structures 15' of a lower substrate 11', at least some of which can be prevented using the invention. Certain of the overlay faults are known under the name run-out faults.

The overlay fault according to FIG. 8.I. is a non-congruent overlap of an upper structure 15 and a lower structure 15' as a typical result of a run-out fault. Although the structures 15, 15' have the same shape, they are not congruent. The cause of a fault of this type is (i) a fundamentally incorrect production of the structures 15, 15' on the substrates 11, 11' and/or (ii) a distortion of the structures 15, 15', particularly due to a distortion of the substrates 11, 11', before the bonding and/or (iii) a distortion of the structures 15, 15', particularly due to a distortion of the substrates 11, 11', during the bonding, A further possibility is a global displacement of the two substrates 11, IV with respect to one another. In this case however there would be a fundamental alignment problem of the global alignment of two substrates with respect to one another, which is seldom associated with the term run-out.

FIG. 8-II. shows a further overlay fault of two structures 15 and 15' which are rotated with respect to one another. The rotation of the two structures 15 and 15' with respect to one another is illustrated in an exaggerated fashion and in reality only makes up a few degrees, in particular only a few tenths of a degree. This occurs if the two structures 15, 15' either (i) were not produced correctly on the two substrates 11 and 11' and/or (ii) there is an, in particular local, distortion in the vicinity of the structures 15, 15' before the bonding process, which leads to a corresponding, in particular local, rotation of the two structures 15, 15' with respect to one another and/or (iii) an, in particular local, distortion occurs in the vicinity of the structures 15, 15' during the bonding process, which leads to a corresponding, in particular local, rotation of the two structures 15, 15' with respect to one another. A further possibility is a global twisting of the two substrates 11, 11' with respect to one another. In this case, an overlay fault of type 8-II must be detectable at a plurality of positions between the two substrates 11, 11', particularly increasingly radially from the inside outwards.

The overlay faults according to FIGS. 8-III. to 8-VII. are predominantly scaling faults, which arise due to an (i) incorrect production and/or (ii) distortion of the structures 15, 15', particularly due to a distortion of the substrates 11, 11' before the bonding and/or (ii) distortion of the structures 15, 15', particularly due to a distortion of the substrate 11, 11' during the bonding. They are not typically termed run-out faults.

Figure 9:
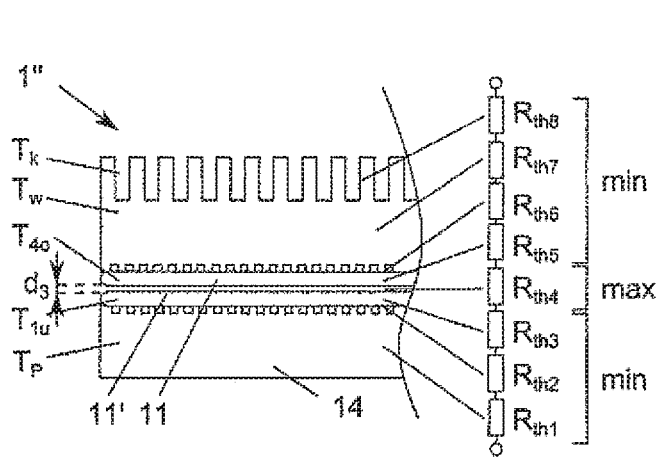

FIG. 9 shows a schematic sectioned partial view, which is not true to scale, of a substrate holder according to the invention with an equivalent circuit diagram of the thermal resistances Rth1 to Rth8, as has been described previously. The thermal resistances Rth1 to Rth3 should be minimal, in order to enable a maximum heat conduction from the lower substrate holder 14, which in particular has a heating device (not drawn in), to the lower substrate 11'. As a result, an efficient and rapid heating of the lower substrate 11' is enabled according to the invention. Furthermore, a change in the temperature T1$u$ of the lower substrate 11' can be effected very rapidly by means of a chain of minimum thermal resistances.

The thermal resistance Rth4 should be maximal according to the invention. In a purely theoretical ideal case of an infinitely large thermal resistance Rth4, no amount of heat would reach the upper substrate 11 from the lower substrate 11'. Due to the finite nature of the thermal resistance Rth4, an amount of heat, which is not vanishingly small, always reaches the upper substrate 11 from the lower substrate 11'. The thermal resistance Rth4 can be set relatively easily and exactly by choosing a vacuum or a specific gas mixture between the two substrates 11 and 11'.

The thermal resistances Rth5 to Rth8 should in turn be minimal according to the invention, in order to enable a maximum possible and therefore efficient heat conduction between the cooling fluid, particularly the atmosphere, and the upper substrate 11. The correct, targeted and reproducible setting of an upper temperature T4$o$ or the temperature difference $\Delta T$ between the temperature T4$o$ of the upper substrate 11 and the temperature T1$u$ of the lower substrate 11' during the bonding process in the temperature saturation region d is of decisive importance and importance according to the invention. This is achieved according to the invention primarily by means of (i) the targeted selection of at least one of the thermal resistances Rth1 to Rth8 and/or (ii) the setting of the lower temperature T1$u$-Tp, particularly by means of a heating device in the lower substrate holder 14 and/or (iii) setting the upper temperature T1$o$-Tk, particularly by means of the cooling fluid according to the invention.

REFERENCE LIST

1, 1', 1", 1''', 1$^{IV}$ Substrate holder
2, 2', 2", 2''', 2$^{IV}$ Heat-conducting body
3 Ribs
30 Rib surface
4 Fixing part
4$o$ Fixing surface
5 Fixing element
6 Boundary surface
7 Hole
8 Deformation element
9 Depression/recess/excavation
10 Nubs/needles
11, 11' Substrate
12, 12', 12", 12''' Temperature graph
13 Distance graph
14 Lower substrate holder
15, 15' Structure
d1, d2, d3 Substrate distance
t1 Time period
T1$o$, T2$o$, T3$o$ Temperature/temperature curve sections
T4$o$, T5$o$ Temperature/temperature curve sections
Tp Substrate holder temperature
Tw Heat-conducting body temperature
Tk Cooling fluid temperature
a, b, c, c', d, d', e, f Temperature regions Having described the invention, the following is claimed:

1. A method for bonding an upper substrate to a lower substrate, the method comprising:
   aligning the upper substrate to the lower substrate when a distance between the upper substrate and the lower substrate is (d1);
   heating the lower substrate such that the heated lower substrate radiates heat and heats the upper substrate at the distance (d1) to a first temperature;
   bringing the upper substrate and the heated lower substrate toward each other from the distance (d1) until a distance (d3) is reached between the upper substrate and the heated lower substrate at which time a time period (t1) begins during which, a second temperature of the upper substrate is achieved and remains constant;
   during the time period (t1) when the second temperature of the upper substrate remains constant, pushing a center of the upper substrate into contact with a center of the heated lower substrate while edges of the upper substrate remain at the distance (d3) from edges of the heated lower substrate; and
   ending the time period (t1) by dropping the edges of the upper substrate onto the edges of the heated lower substrate after the center of the upper substrate is pushed into contact with the center of the heated lower substrate, thereby at least temporarily bonding the upper substrate to the lower substrate.

2. A method for bonding an upper substrate to a lower substrate, the method comprising:
   heating the lower substrate;
   bringing the upper and the heated lower substrates toward each other such that the heated lower substrate increases a temperature of the upper substrate as the upper substrate approaches the heated lower substrate, the upper and the heated lower substrates being brought toward each other until a distance (d3) is obtained between the upper and the heated lower substrates at which time a time period (t1) begins during which a constant temperature of the upper substrate is maintained; and
   at least temporarily bonding the upper and the heated lower substrates to one another within the time period (t1) such that the time period (t1) begins when the distance (d3) is obtained and ends when the at least temporarily bonding of the upper and the heated lower substrates is achieved,
   wherein, during at least a portion of the time period (t1), one portion of the upper substrate is caused to be in contact with the heated lower substrate while another portion of the upper substrate remains out of contact with the heated lower substrate.

3. The method according to claim 2, wherein the distance (d3) of the portion of the upper substrate that remains out of contact with the heated lower substrate is between 1 mm and 0 mm.

4. The method according to claim 2, wherein the time period (t1) is greater than 5 seconds.

5. The method according to claim 2, further comprising, before the bringing of the upper and lower substrates toward each other:
  determining one or more of the time period (t1), the distance (d3), and the constant temperature.

6. The method according to claim 2, further comprising, before the bringing of the upper and lower substrates toward each other:
  empirically determining one or more of the time period (t1), the distance (d3), and the constant temperature.

7. The method according to claim 5, wherein the determining of the one or more of the time period (t1), the distance (d3), and the constant temperature is based on one or more of a temperature of the lower substrate, materials of a substrate holder, materials of heat-conducting bodies, materials of the upper and lower substrates, and an approach speed of the upper and lower substrates.

\* \* \* \* \*